US011621301B2

(12) United States Patent
Inoue

(10) Patent No.: US 11,621,301 B2
(45) Date of Patent: Apr. 4, 2023

(54) DISPLAY DEVICE AND SIGNAL PROCESSING DEVICE

(71) Applicant: Saturn Licensing LLC, New York, NY (US)

(72) Inventor: Yasuo Inoue, Tokyo (JP)

(73) Assignee: Saturn Licensing LLC, New York, NY (US)

( * ) Notice: Subject to any disclaimer, the term of this patent is extended or adjusted under 35 U.S.C. 154(b) by 0 days.

(21) Appl. No.: 17/480,843

(22) Filed: Sep. 21, 2021

(65) Prior Publication Data

US 2022/0005880 A1 Jan. 6, 2022

Related U.S. Application Data

(63) Continuation of application No. 16/342,666, filed as application No. PCT/JP2018/031871 on Aug. 29, 2018, now Pat. No. 11,158,678.

(30) Foreign Application Priority Data

Sep. 12, 2017 (JP) .................................. 2017-175002

(51) Int. Cl.
*H01L 27/32* (2006.01)
*G09G 5/02* (2006.01)
(Continued)

(52) U.S. Cl.
CPC ............ *H01L 27/3211* (2013.01); *G09F 9/30* (2013.01); *G09F 9/302* (2013.01); *G09G 3/20* (2013.01);
(Continued)

(58) Field of Classification Search
CPC ... G09F 9/30; G09F 9/302; G09G 2300/0452; G09G 2320/0271; G09G 2320/0276;
(Continued)

(56) References Cited

U.S. PATENT DOCUMENTS 9,478,173 B2 10/2016 Safaee-Rad et al.
11,158,678 B2 * 10/2021 Inoue ....................... G09G 5/02
(Continued)

FOREIGN PATENT DOCUMENTS

CN 101630498 A 1/2010
CN 105719608 A 6/2016
(Continued)

OTHER PUBLICATIONS

International Search Report corresponding to PCT/JP2018/031871, dated Nov. 27, 2018, 3 pgs.
(Continued)

*Primary Examiner* — Afroza Chowdhury
(74) *Attorney, Agent, or Firm* — Lerner, David, Littenberg, Krumholz & Mentlik, LLP

(57) ABSTRACT

The present technology relates to a display device and a signal processing device that have made it possible to actively utilize maximumly a color gamut that a display panel can express.
Provided is a display device, including: a display section in which display pixels that each include a first subpixel, a second subpixel, and a third subpixel that emit three-basic-color light and a fourth subpixel that emits non-basic-color light are arranged two-dimensionally; a first signal processing section that expands a video signal being input and corresponding to the basic-color light and adapts the video signal to a color gamut that the display section can express; and a second signal processing section that converts an expanded video signal being the video signal having been expanded into a first signal, a second signal, and a third signal that correspond to the basic-color light and a fourth signal that corresponds to the non-basic-color light, and outputs the signals to the display section. The present
(Continued)

technology can be applied to, for example, a self-light-emission type display device, such as an organic EL display device.

21 Claims, 12 Drawing Sheets

(51) Int. Cl.
    *H04N 9/64*     (2006.01)
    *G09G 3/20*     (2006.01)
    *G09F 9/30*     (2006.01)
    *G09G 3/3208*     (2016.01)
    *H01L 51/50*     (2006.01)
    *H04N 9/30*     (2006.01)
    *G09F 9/302*     (2006.01)

(52) U.S. Cl.
    CPC ......... *G09G 3/2003* (2013.01); *G09G 3/3208* (2013.01); *G09G 5/02* (2013.01); *H01L 27/32* (2013.01); *H01L 51/50* (2013.01); *H04N 9/30* (2013.01); *H04N 9/64* (2013.01); *G09G 2300/0452* (2013.01); *G09G 2320/0271* (2013.01); *G09G 2320/0276* (2013.01); *G09G 2320/0673* (2013.01); *G09G 2330/021* (2013.01); *G09G 2340/06* (2013.01); *G09G 2360/16* (2013.01)

(58) Field of Classification Search
    CPC ..... G09G 2320/0673; G09G 2330/021; G09G 2340/06; G09G 2360/16; G09G 3/20; G09G 3/2003; G09G 3/3208; G09G 5/02; H01L 27/32; H01L 27/3211; H01L 51/50; H04N 9/30; H04N 9/64

See application file for complete search history.

(56) References Cited

U.S. PATENT DOCUMENTS

| | | |
|---|---|---|
| 2008/0297448 A1 | 12/2008 | Mizukoshi et al. |
| 2009/0304279 A1 | 12/2009 | Mori |
| 2010/0007679 A1 | 1/2010 | Sakaigawa |
| 2011/0181635 A1 | 7/2011 | Kabe et al. |
| 2013/0335457 A1 | 12/2013 | Yano et al. |
| 2014/0176620 A1 | 6/2014 | Yano et al. |
| 2014/0198140 A1 | 7/2014 | Yano et al. |
| 2014/0253421 A1 | 9/2014 | Izumi et al. |
| 2016/0163286 A1 | 6/2016 | Yang et al. |
| 2016/0180782 A1 | 6/2016 | Nakaya |
| 2018/0018793 A1 | 1/2018 | Min et al. |

FOREIGN PATENT DOCUMENTS

| | | |
|---|---|---|
| CN | 106328095 A | 1/2017 |
| JP | 2005062440 A | 3/2005 |
| JP | 2005354532 A | 12/2005 |
| JP | 2006003475 A | 1/2006 |
| JP | 2009300517 A | 12/2009 |
| JP | 2011154323 A | 8/2011 |
| JP | 2012058634 A | 3/2012 |
| JP | 2014122997 A | 7/2014 |
| WO | 2007116589 A1 | 10/2007 |

OTHER PUBLICATIONS

Office Action for Chinese Application No. 201880004138.5 dated Aug. 25, 2022. 5 pgs.

* cited by examiner

DISPLAY DEVICE AND SIGNAL PROCESSING DEVICE

CROSS REFERENCE TO RELATED APPLICATIONS

The present application is a continuation application of U.S. patent application Ser. No. 16/342,666, filed on Apr. 17, 2019, which is a national phase entry under 35 U.S.C. § 371 of International Application No. PCT/JP2018/031871, filed on Aug. 29, 2018, which claims the priority from Japanese Patent Application No. 2017-175002, filed in the Japanese Patent Office on Sep. 12, 2017, the disclosures of which are hereby incorporated herein by reference.

TECHNICAL FIELD

The present technology relates to a display device and a signal processing device, and, in particular, relates to a display device and a signal processing device that have made it possible to actively utilize maximumly a color gamut that a display panel can express.

BACKGROUND ART

In recent years, as a light emitting element in which an element itself emits light upon application of a voltage, advanced has been the development of self-light-emission type display devices such as an organic EL display device etc. that use an organic light emitting diode (OLED: Organic Light Emitting Diode) to which phenomenon called organic electroluminescence (organic EL) has been applied.

As the technology with regard to an organic EL display device, for example, the technology disclosed in Patent Literature 1 has been known. In Patent Literature 1, the technology for complementing the lowering of light emission luminance in association with deterioration of the light emission efficiency of a light emitting element, has been disclosed.

DISCLOSURE OF INVENTION

Technical Problem

Incidentally, in the self-light-emission type display devices, there is one in which each pixel includes four subpixels, i.e., subpixels of red (R), green (G), blue (B), and white (W).

In addition to subpixels of red (R), green (G), and blue (B) that emit basic-color light, by adding a subpixel of white (W), it becomes possible to expand a color expression range of each pixel. However, a technical system for actively utilizing maximumly a color gamut capable of being expressed by such a display panel has not been established.

The present technology has been achieved in view of such a situation, and makes it possible to actively utilize maximumly a color gamut that a display panel can express.

Solution to Problem

A display device of one aspect of the present technology is a display device, including: a display section in which display pixels that each include a first subpixel, a second subpixel, and a third subpixel that emit three-basic-color light and a fourth subpixel that emits non-basic-color light are arranged two-dimensionally; a first signal processing section that expands a video signal being input and corresponding to the basic-color light and adapts the video signal to a color gamut that the display section can express; and a second signal processing section that converts an expanded video signal being the video signal having been expanded into a first signal, a second signal, and a third signal that correspond to the basic-color light and a fourth signal that corresponds to the non-basic-color light, and outputs the signals to the display section.

In the display device of one aspect of the present technology, a video signal being input and corresponding to the basic-color light is expanded, and is adapted to a color gamut that a display section, in which display pixels that each include a first subpixel, a second subpixel, and a third subpixel that emit three-basic-color light and a fourth subpixel that emits non-basic-color light are arranged two-dimensionally, can express. An expanded video signal being the video signal having been expanded is converted into a first signal, a second signal, and a third signal that correspond to the basic-color light and a fourth signal that corresponds to the non-basic-color light, and the signals are output to the display section.

A signal processing device of one aspect of the present technology is a signal processing device, including: a signal processing section that expands a video signal that is input, and outputs an expanded video signal adapted to a color gamut that a display section can express. In the display section, display pixels that each include a first subpixel, a second subpixel, and a third subpixel that emit three-basic-color light and a fourth subpixel that emits non-basic-color light are arranged two-dimensionally, and the video signal is a signal corresponding to the basic-color light.

In the signal processing device of one aspect of the present technology, a video signal that is input is expanded, and an expanded video signal adapted to a color gamut that a display section can express is output. At this time, in the display section, display pixels that each include a first subpixel, a second subpixel, and a third subpixel that emit three-basic-color light and a fourth subpixel that emits non-basic-color light are arranged two-dimensionally, and the video signal is a signal corresponding to the basic-color light.

The display device and signal processing device of one aspect of the present technology may be an independent device, or may be an internal block constituting one device.

Advantageous Effects of Invention

According to one aspect of the present technology, a color gamut capable being expressed by a display panel can be actively utilized maximumly.

In this connection, the effects described in here are not necessarily limited, and may be any of the effects described in the present disclosure.

MODE(S) FOR CARRYING OUT THE INVENTION

Hereinafter, with reference to drawings, an embodiment of the present technology will be described. It should be noted that description will be given in the following order.
1. Embodiment of present technology
2. Modified example <1. Embodiment of Present Technology>

As a thin type flat display device (for example, thin type television receiver), for example, self-light-emission type display devices, such as a liquid crystal display device using liquid crystal and an organic EL display device using organic electroluminescence (organic EL), are put into practical use.

In the liquid crystal display device, there is provided back light and the arrangement of liquid crystal molecules are adapted to be changed by the application of voltage such that light from the back light is made to pass through or to be blocked off, whereby a video image is displayed.

(Constitution of Liquid Crystal Display Device)

Figure 1:
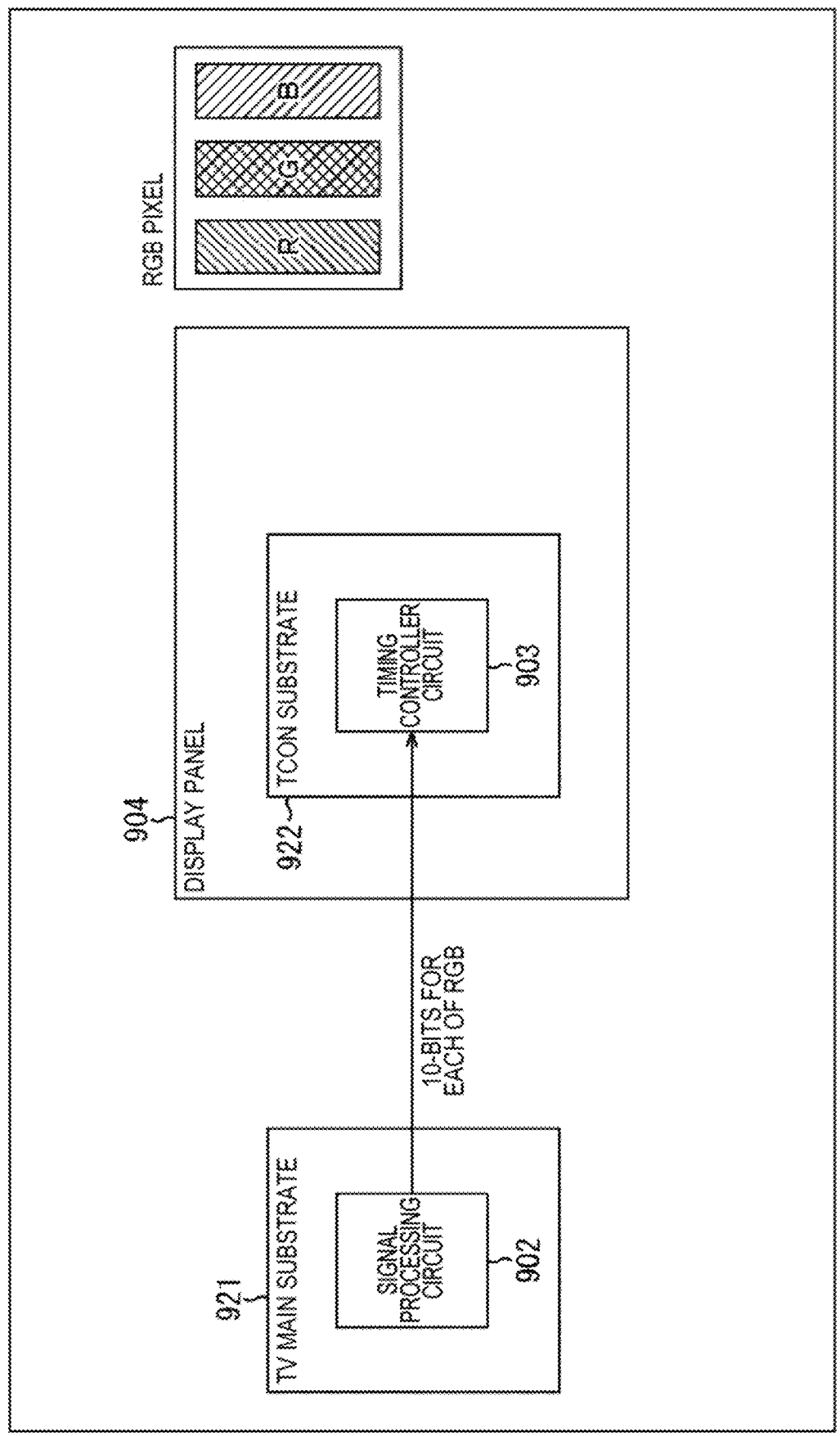
FIG. 1 is a diagram showing an example of an interface of a substrate in a liquid crystal display device.

FIG. 1 shows an example of an interface (I/F) between a signal processing circuit 902 and a timing controller circuit 903 each being an LSI (Large Scale Integration) disposed in a liquid crystal display device. In this connection, in FIG. 1, the signal processing circuit 902 is disposed in a TV main substrate 921, and the timing controller circuit 903 is disposed in a TCON (Timing Controller) substrate 922.

In FIG. 1, a display panel 904 is constituted as a liquid crystal display panel. In this liquid crystal display panel, a plurality of pixels (display pixels) is arranged in a two-dimensional form (matrix form), and each pixel includes three subpixels of red (R), green (G), and blue (B). That is, in the display panel 904 being a liquid crystal display panel, each pixel arranged in the two-dimensional form is made an RGB pixel.

Here, since each pixel arranged in the display panel 904 is constituted as an RGB pixel, the signal processing circuit 902 can transmit a signal in which 10 bits are allocated to each of R/G/B, as an RGB signal that turns on each pixel arranged in the display panel 904, to the timing controller circuit 903 via a predetermined interface (I/F).

In this way, in the liquid crystal display device, as the interface (I/F) between the signal processing circuit 902 on the TV main substrate 921 side and the timing controller circuit 903 on the TCON substrate 922 side, an interface (I/F) that transmits a signal including 10-bits for each of R/G/B becomes standard.

In this connection, as an interface (I/F) of a thin type flat display device (for example, thin type television receiver), V-by-One (registered trademark) has been widely known. Moreover, a video signal output from the signal processing circuit 902 can be made, for example, a video signal corresponding to a 4K video image or a 2K video image.

(Color Expression of RGB Pixel)

Figure 2:
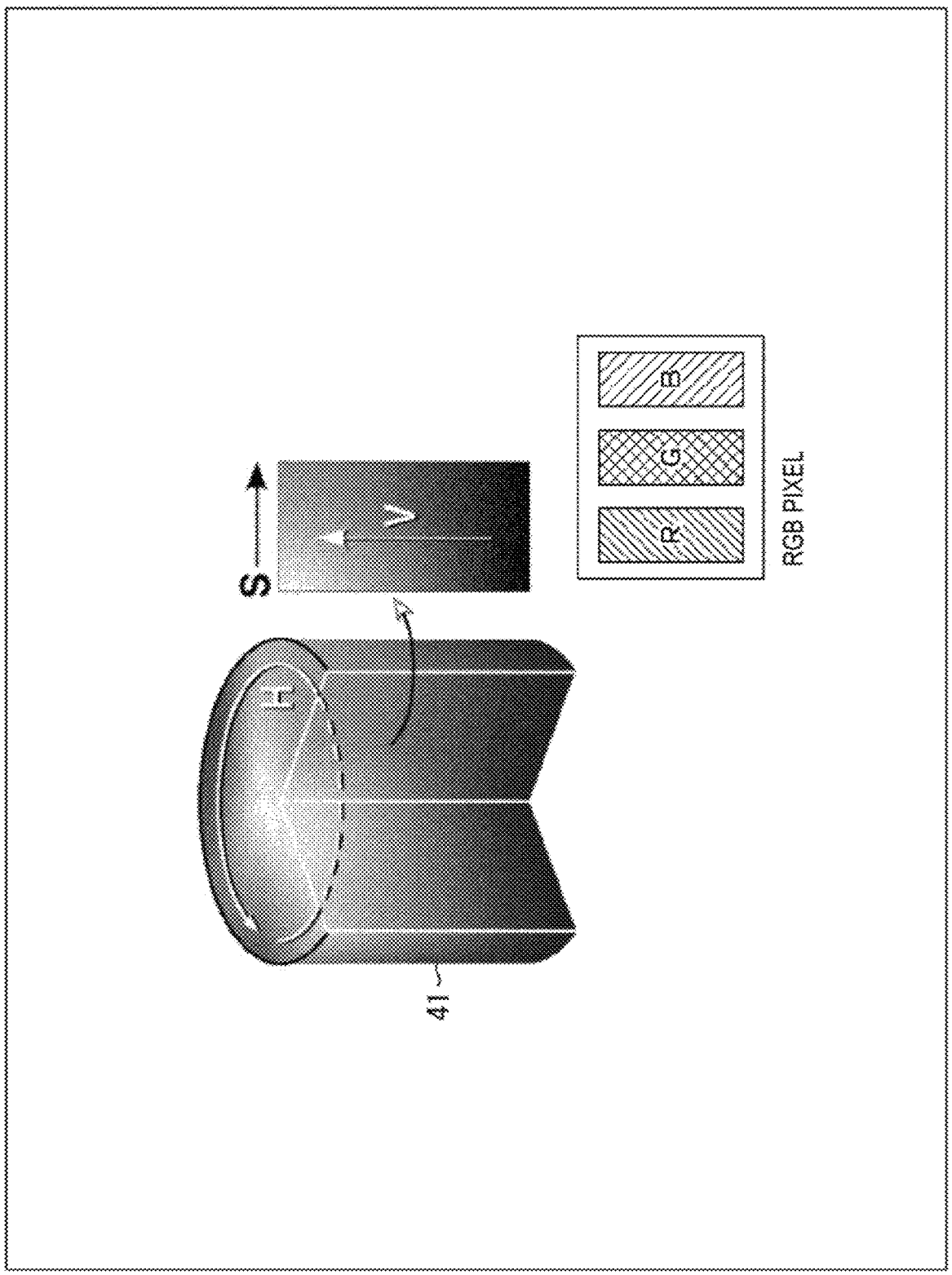
FIG. 2 is an illustration showing an example of a color expression range of an RGB pixel.

FIG. 2 shows an example of a color expression range of an RGB pixel to be arranged in the display panel 904 in FIG. 1.

In FIG. 2, the color expression range of an RGB pixel is expressed with an HSV color space. The HSV model is a color space including three components of hue (Hue), saturation (Saturation), and lightness (Value). Here, the hue means the kind of color, the saturation means the vividness of color, and the lightness means the lightness of a color, respectively.

In FIG. 2, the HSV color space is expressed by a column 41. In this column 41 of the HSV color space, an azimuth direction represents hue H (Hue), a radial direction represents saturation S (Saturation), and an axial direction represents lightness V (Value). In this connection, in FIG. 2, the illustration is made by cutting out a part of the cross section of the hue H in the HSV color space.

In this way, the column 41 of the HSV color space corresponds to a range of color capable of being expressed by three subpixels of red (R), green (G), and blue (B).

In the above, the liquid crystal display device has been mentioned. In recent years, the development of self-light-emission type display devices such as an organic EL display device, have been advanced. Unlike the liquid crystal display devices that need back light, the self-light-emission type display devices of this kind do not need back light, because an element itself emits light. Accordingly, as compared with the liquid crystal display devices, they are deemed as being advantageous in a matter capable of being constituted to be thinner and also in aspects of image quality, viewing angle, and the like. Hereinafter, as the self-light-emission type display devices, particularly, an organic EL display device will be described.

(Constitution Example of Display Device)

Figure 3:
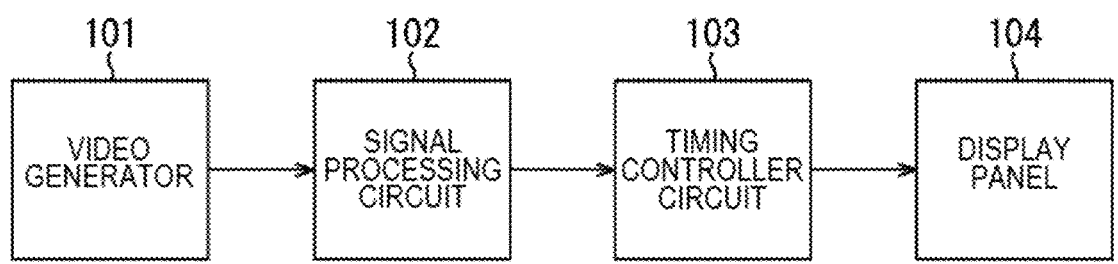
FIG. 3 is a block diagram showing an example of a constitution of one embodiment of a display device to which the present technology has been applied.

FIG. 3 is a block diagram showing an example of a constitution of one embodiment of a display device to which the present technology has been applied.

A display device 10 shown in FIG. 3 is constituted, for example, as a self-light-emission type display device, such as a thin type television receiver and a business-use display device.

For example, the display device 10 is constituted as an organic EL display device including an organic EL display panel that uses an organic light emitting diode (OLED) applied with the phenomenon of organic electroluminescence (organic EL) as a light emitting element in which an element itself emits light upon application of a voltage.

In FIG. 3, the display device 10 includes a video generator 101, a signal processing circuit 102, a timing controller circuit 103, and a display panel 104.

For example, on the basis of signals input from an external device, such as signals acquired by a process in a tuner, a demodulator, and the like, the video generator 101 generates video signals, and supplies them to the signal processing circuit 102. This video signal is an RGB signal including the luminance information of red (R), green (G), and blue (B).

The signal processing circuit 102 is constituted as, for example, a signal processing LSI for TV, and so on. The signal processing circuit 102 applies predetermined signal processing for realizing, for example, high definition, a wide color gamut, high luminance, high contrast, and the like for a video signal supplied from the video generator 101, and supplies the video signal acquired as a result to the timing controller circuit 103.

The timing controller circuit 103 is constituted as a TCON (Timing Controller) LSI for a panel, or the like, and performs timing control of a display action in the display panel 104. Moreover, the timing controller circuit 103 processes the video signals supplied from the signal processing circuit 102, and outputs them to the display panel 104.

The display panel 104 is constituted as, for example, a self-light-emission display section, such as an organic EL display panel. This self-light-emission display section includes a pixel, as a display pixel, including a light emitting element that performs self-light-emission in accordance with an amount of an electric current. The display panel 104 displays a video image corresponding to video signals in accordance with the control from the timing controller circuit 103.

The display device 10 is constituted as mentioned in the above.

(Constitution of Organic EL Display Device)

Figure 4:
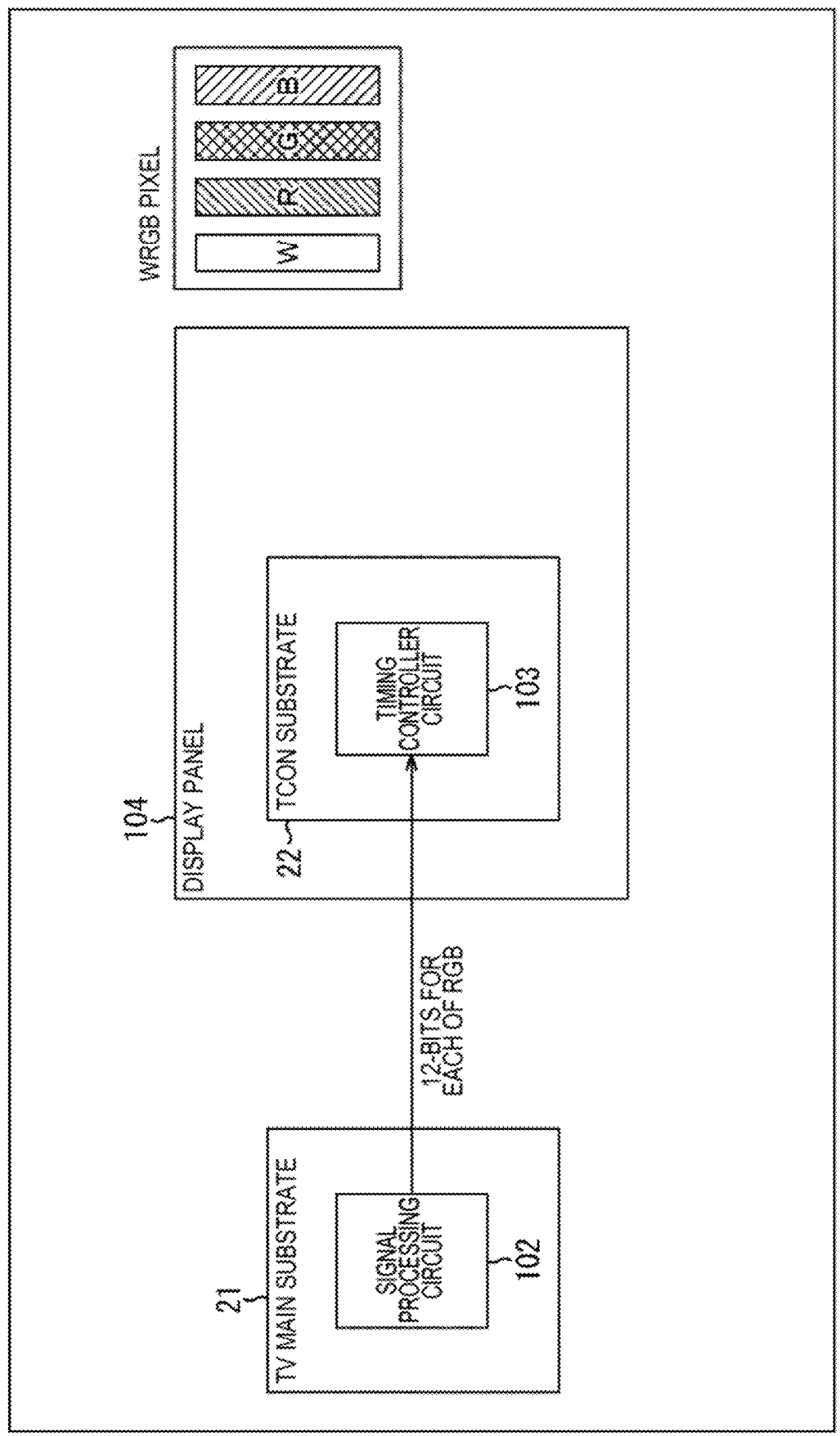
FIG. 4 is a diagram showing an example of an interface of a substrate in an organic EL display device.

FIG. 4 shows an example of an interface (I/F) between a signal processing circuit 102 and a timing controller circuit 103, which are an LSI disposed in the display device 10 as an organic EL display device. In this connection, in FIG. 4, the signal processing circuit 102 is disposed in the TV main substrate 21, and the timing controller circuit 103 is disposed in the TCON substrate 22.

In FIG. 4, the display panel 104 is constituted as an organic EL display panel. In this organic EL display panel, a plurality of pixels (display pixels) is arranged in a two-dimension form (matrix form), and each pixel includes four subpixels of red (R), green (G), blue (B), and white (W). That is, in the display panel 104 being an organic EL display panel, each pixel arranged in the two-dimension form is made a WRGB pixel.

In this connection, the reason why a subpixel of white (W) is provided as a subpixel of each pixel in addition to subpixels of red (R), green (G), and blue (B), is derived from unique circumstances due to the manufacturability of the organic EL display panel. In the present situation, each pixel of a mass-produced large-sized organic EL display panel includes a WRGB pixel.

Here, each pixel arranged in the display panel 104 is constituted as a WRGB pixel. However, as an RGB signal for turning on each pixel arranged in the display panel 104, for example, the signal processing circuit 102 can transmit a signal in which 12 bits are allocated to each of R/G/B, to the timing controller circuit 103 via a predetermined interface (I/F).

At this time, although each pixel arranged in the display panel 104 becomes a WRGB pixel, a video signal output from the signal processing circuit 102 has become an RGB signal. For this reason, in the timing controller circuit 103, by generating a WRGB signal on the basis of an RGB signal from the signal processing circuit 102, it is possible to turn on each pixel being a WRGB pixel arranged in the display panel 104.

In this connection, also in the display device 10 as an organic EL display device, V-by-One (registered trademark) can be employed as an interface (I/F) between the signal processing circuit 102 on the TV main substrate 21 side and the timing controller circuit 103 on the TCON substrate 22 side. Moreover, a video signal output from the signal processing circuit 102 can be made, for example, a video signal corresponding to a 4K video image or a 2K video image.

(Color Expression of WRGB Pixel)

Figure 5:
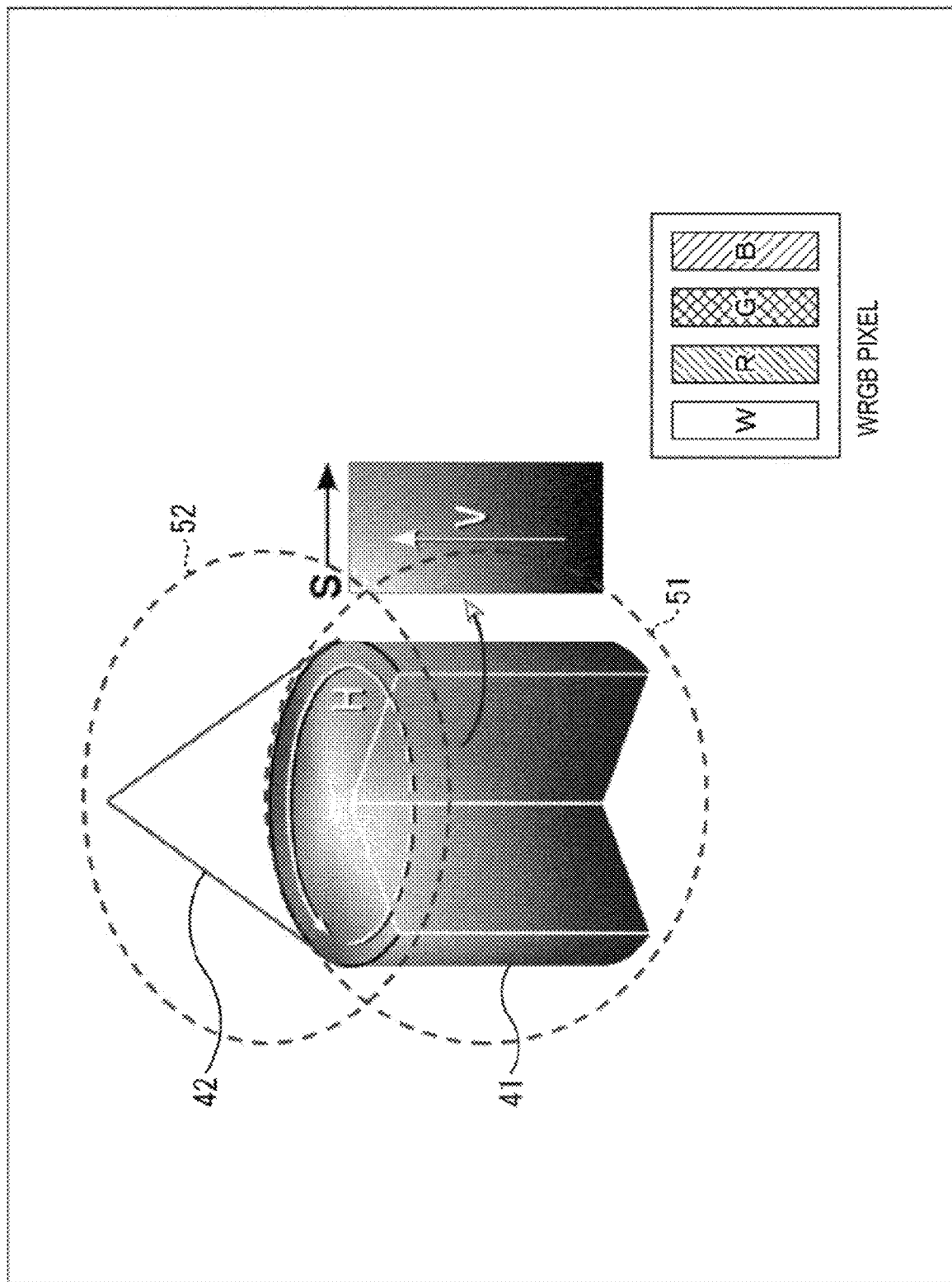
FIG. 5 is an illustration showing an example of a color expression range of a WRGB pixel.

FIG. 5 shows an example of a color expression range of a WRGB pixel to be arranged in the display panel 104 in FIG. 4.

In FIG. 5, similarly to the color expression range of the RGB pixel shown in FIG. 2, the color expression range of a WRGB pixel is expressed with the HSV color space.

In FIG. 5, a column 41 in the HSV color space corresponds to a range of color capable of being expressed by three subpixels of red (R), green (G), and blue (B). Moreover, in FIG. 5, a cone 42 formed on the column 41 in the HSV color space corresponds to a range of color capable of being expressed by a subpixel of white (W).

Namely, in a range of color capable of being expressed by subpixels that emit three-basic-color light (red light, green light, and blue light) of red (R), green (G), and blue (B) and a subpixel that emits one non-basic-color light of white (W) in each pixel arranged in the display panel 104, in addition to a region 51 of a column-shaped portion in the diagram, a region 52 of a cone-shaped portion formed on the column is also included.

In this way, by making a subpixel of white (W) emit light, it becomes possible to make the lightness V expressed in the axial direction in the column 41 of the HSV color space, higher. Accordingly, as compared with the with an RGB pixel, the WRGB pixel can expand a color gamut capable of being expressed.

Next, description is given for a detailed constitution of the signal processing circuit 102 and the timing controller circuit 103, which are an LSI disposed in the display device 10 shown in FIG. 3. Here, a constitution of the LSI in the current state is described with reference to FIG. 6 through FIG. 9, and, thereafter, with reference to FIG. 10 through FIG. 12, a constitution of the LSI to which the present technology has been applied will be described.

(Constitution of LSI in Current State)

Figure 6:
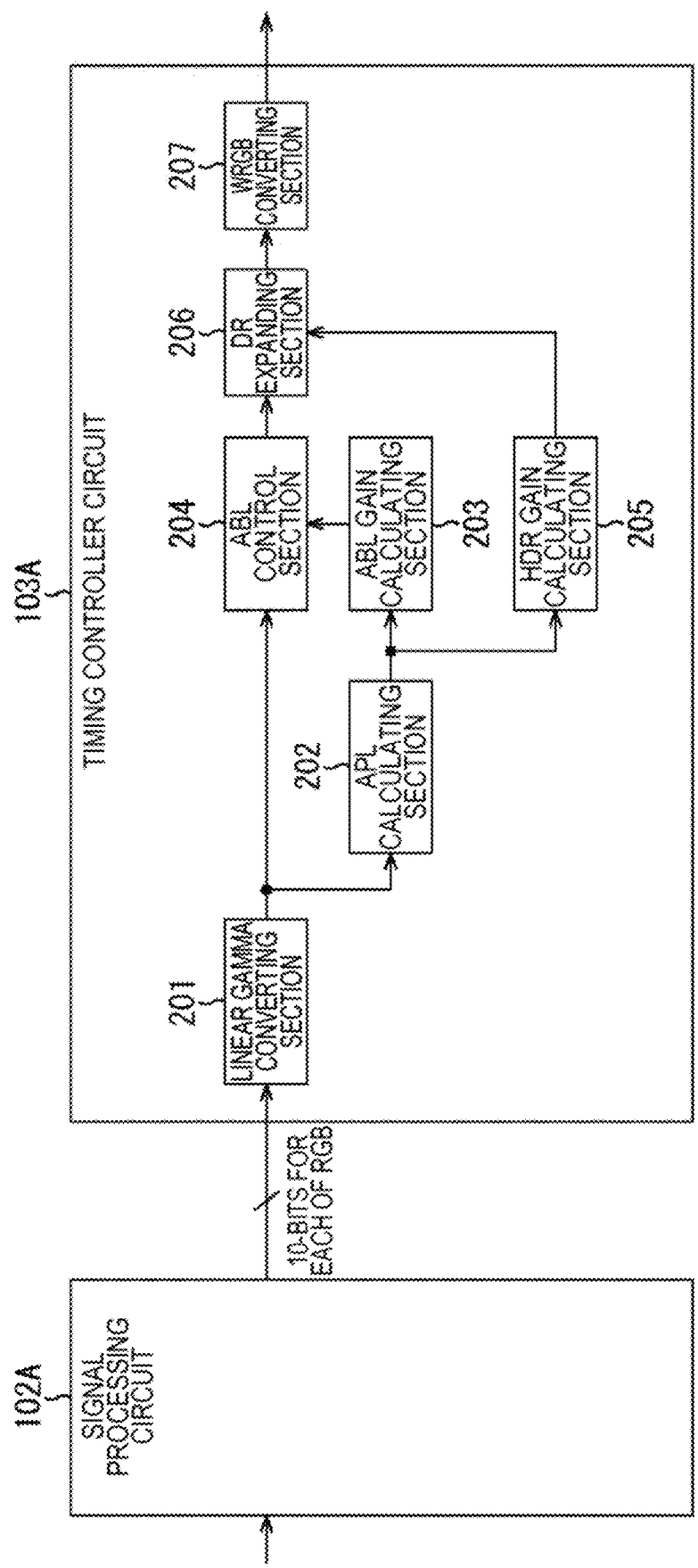
FIG. 6 is a block diagram showing an example of a constitution of a signal processing circuit and a timing controller circuit in the current state.

First, a constitution of the LSI in the current state is described. FIG. 6 is a block diagram showing an example of a constitution of the signal processing circuit 102A and the timing controller circuit 103A that constitute the LSI in the current state.

In FIG. 6, the signal processing circuit 102A performs predetermined signal processing to a video signal that is input there, and supplies a signal including 10-bits for each of RGB acquired as a result to the timing controller circuit 103A as a video signal. The timing controller circuit 103A performs control for displaying the video signal supplied from the signal processing circuit 102A on the display panel 104.

The timing controller circuit 103A includes a linear gamma converting section 201, an APL calculating section 202, an ABL gain calculating section 203, an ABL control section 204, an HDR gain calculating section 205, a DR expanding section 206, and a WRGB converting section 207.

The linear gamma converting section 201 performs signal processing for converting a video signal (a signal including 10-bit for each of RGB) in which an output has a gamma characteristic relative to an input, so as to have a linear characteristic from the gamma characteristic. The linear gamma converting section 201 supplies the video signal after the conversion to the APL calculating section 202 and the ABL control section 204.

In this connection, in the linear gamma converting section 201, by performing the signal processing such that an output has a linear characteristic relative to an input, a video signal is handled in a linear space. Accordingly, various kinds of processing for a video image to be displayed on the display panel 104 constituted as an organic EL display panel, become easy.

On the basis of the video signal supplied from the linear gamma converting section 201, the APL calculating section 202 calculates an average luminance level (APL: Average Picture Level), and supplies it to the ABL gain calculating section 203 and the HDR gain calculating section 205.

Here, the average luminance level (APL) is one that represents an average luminance level of a frame image acquired from a video signal. For example, the average luminance level (APL) is acquired from an average value etc. of the luminance of red (R), green (G), and blue (B) in a frame image.

On the basis of an average luminance level (APL) supplied from the APL calculating section 202, the ABL gain calculating section 203 calculates a gain (hereinafter, also referred to as an ABL gain) for controlling (ABL: Automatic Brightness Limiter) the luminance level of a video signal, and supplies it to the ABL control section 204.

On the basis of the ABL gain supplied from the ABL gain calculating section 203, the ABL control section 204 controls (limits) the luminance level of a video signal supplied from the linear gamma converting section 201, and supplies it to the DR expanding section 206.

Here, an ABL gain becomes information for controlling (limiting) the luminance level of a video signal. Namely, in the display panel 104 constituted as an organic EL display panel, for example, since an electric power load for an electric power source depends on the lightness of a video image (picture pattern) to be displayed on the organic EL display panel, the control (ABL) of a luminance level on the basis of an ABL gain is made to be performed for the whole panel. That is, in here, an optimal luminance level will be detected, and the limit processing of luminance relative to a video signal will become to be performed.

On the basis of an average luminance level (APL) supplied from the APL calculating section 202, the HDR gain calculating section 205 calculates a gain (hereinafter, also referred to an HDR gain) for expanding the dynamic range of a video signal and acquiring an expanded video signal, and supplies it to the DR expanding section 206.

On the basis of the HDR gain supplied from the HDR gain calculating section 205, the DR expanding section 206 expands the dynamic range (DR: Dynamic Range) of a video signal (video signal having been subjected to the ABL control) supplied from the ABL control section 204, and supplies the expanded video signal acquired as a result to the WRGB converting section 207.

The WRGB converting section 207 converts the expanded video signal (RGB signal) supplied from the DR expanding section 206 into a WRGB signal, and outputs it.

The converting process in here is one that converts an RGB signal including three basic colors of red (R), green (G), and blue (B) into a WRGB signal that includes three basic colors of red (R), green (G), and blue (B) and one non-basic color of white (W).

Figure 7:
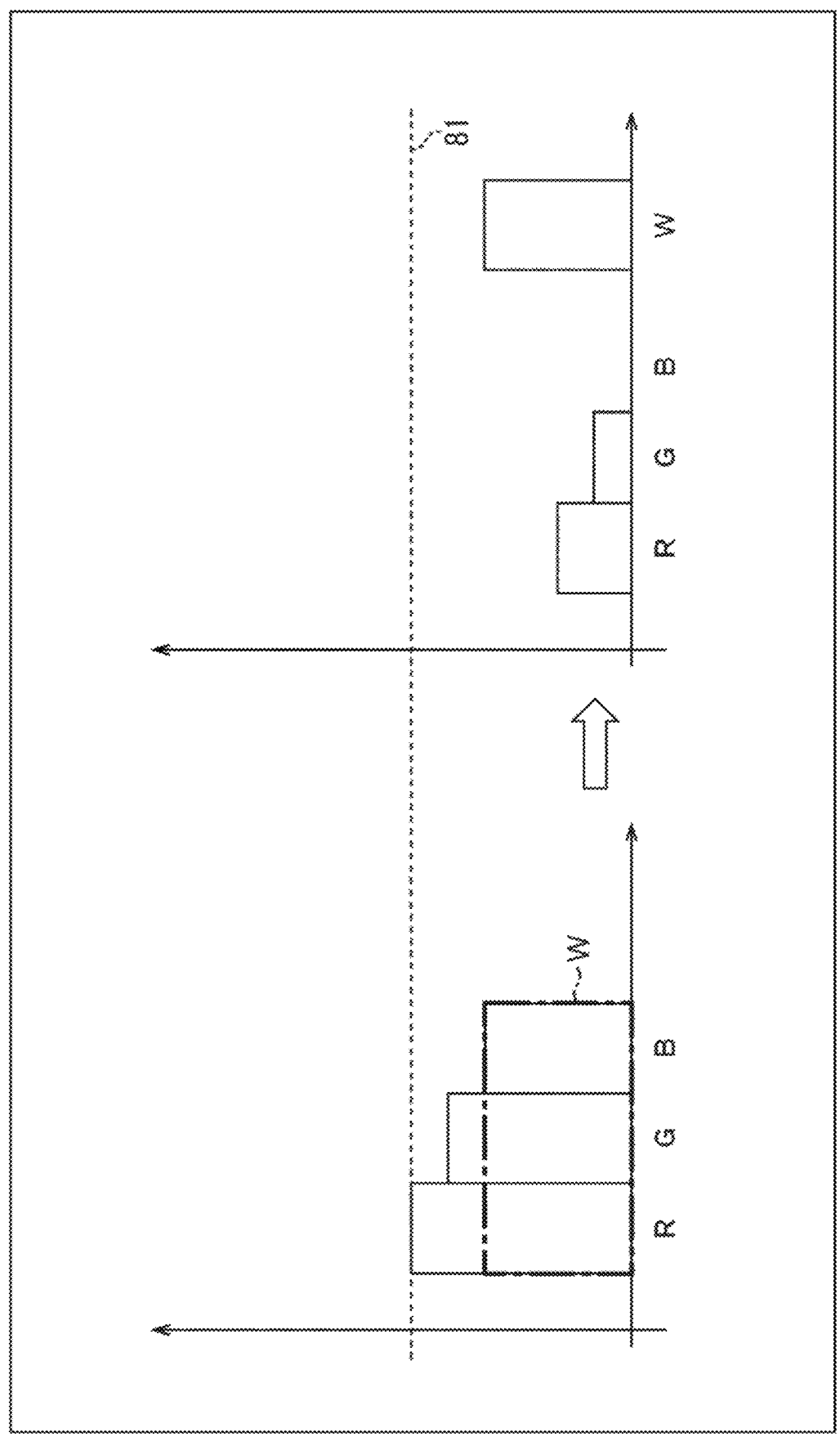
FIG. 7 is a schematic diagram showing an example of conversion from an RGB signal to a WRGB signal in a timing controller circuit in the current state.

FIG. 7 shows schematically an example of the conversion from an RGB signal to a WRGB signal. In this connection, in FIG. 7, the left side in the diagram shows an RGB signal before the conversion, and the right side in the diagram shows a WRGB signal after the conversion.

In the WRGB converting section 207, first, the minimum one among the luminance information of three colors of the input RGB signal is made the luminance information of white (W). In this example, since the luminance information of blue (B) becomes the minimum, it is made the luminance information of white (W).

Then, in the WRGB converting section 207, by subtracting the luminance information of white (W) from the luminance information of red (R) before the conversion, the luminance information of red (R) after the conversion is acquired. Similarly, by subtracting the luminance information of white (W) from the luminance information of green (G) before the conversion, the luminance information of green (G) after the conversion is acquired, and by subtracting the luminance information of white (W) from the luminance information of blue (B) before the conversion, the luminance information (in this example, zero) of blue (B) after the conversion is acquired.

The WRGB converting section 207 outputs the luminance information of red (R), green (G), blue (B), and white (W) acquired by doing in this way, as a WRGB signal.

The LSI in the current state is constituted as mentioned in the above.

Figure 8:
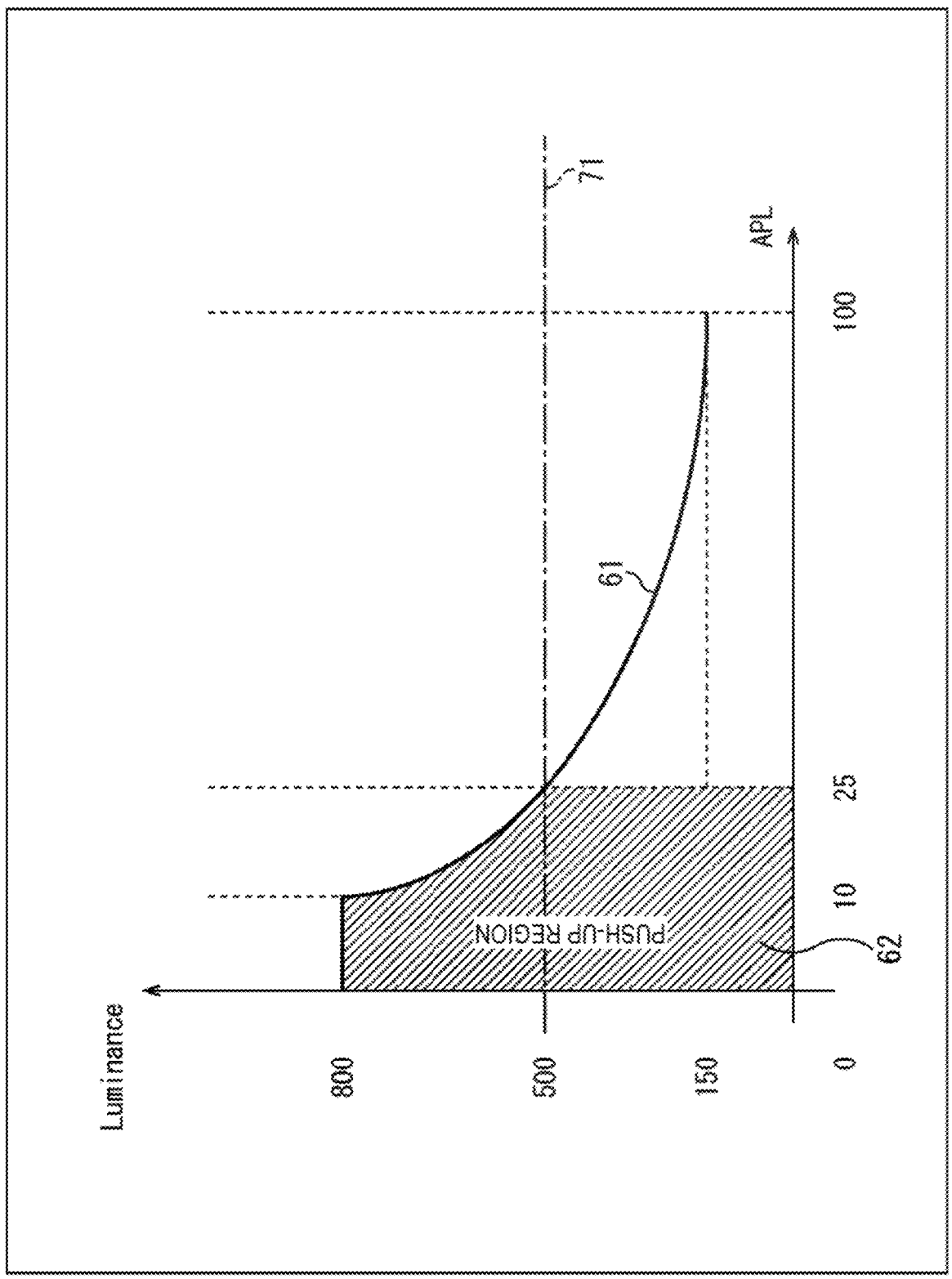
FIG. 8 is a diagram showing a relationship between an average luminance level (APL) and a luminance of a display panel.

Here, FIG. 8 shows a relationship (characteristic information) between an average luminance level (APL) and the luminance of the display panel 104. In FIG. 8, a transverse axis represents an average luminance level (APL), and is made a range of 0 to 100(%). Moreover, a longitudinal axis represents the luminance (Luminance) of the display panel 104, and its unit is set to $cd/m^2$.

In FIG. 8, as shown with a curve 61, a relationship between an average luminance level (APL) and the luminance has become an inversely proportional relation, in which, as the value of an average luminance level (APL) is smaller, the value of the luminance becomes larger, while as the value of an average luminance level (APL) is larger, the value of the luminance becomes smaller.

By utilizing such a relationship, in the ABL control section 204, on the basis of the value of the ABL gain from the ABL gain calculating section 203, as the value of an average luminance level (APL) is larger, the control can be performed in such a way that the luminance level of a video signal is made to lower. For example, in the case where an average luminance level (APL) being 100% has been calculated, the luminance being 500 $cd/m^2$ will be dropped up to 150 $cd/m^2$. In this connection, usually, an average luminance level (APL) is made about 25%.

Namely, as a video image (picture pattern) displayed on the display panel 104 constituted as an organic EL display panel becomes brighter (brilliant more), a load is applied more to a panel or a power source. Accordingly, in here, as an average luminance level (APL) becomes higher, the level of the luminance of a video signal is made to be lowered gradually.

For example, in the case where the luminance corresponding to a range of color capable of being expressed by subpixels of red (R), green (G), and blue (B) in the display panel 104 becomes 500 $cd/m^2$ as shown with a first line 71 shown in the horizontal direction in the diagram, when 100% has been calculated as an average luminance level (APL), an ABL gain is acquired as follows.

Namely, at this time, since an average luminance level (APL) becomes 100%, it is necessary to limit the luminance level up to the luminance being 150 $cd/m^2$. Accordingly, the ABL gain calculating section 203 supplies a gain being 0.3 (150/500) as the ABL gain to the ABL control section 204. With this, on the basis of the ABL gain being 0.3, the ABL control section 204 controls (limits) the luminance level of a video signal.

Figure 9:
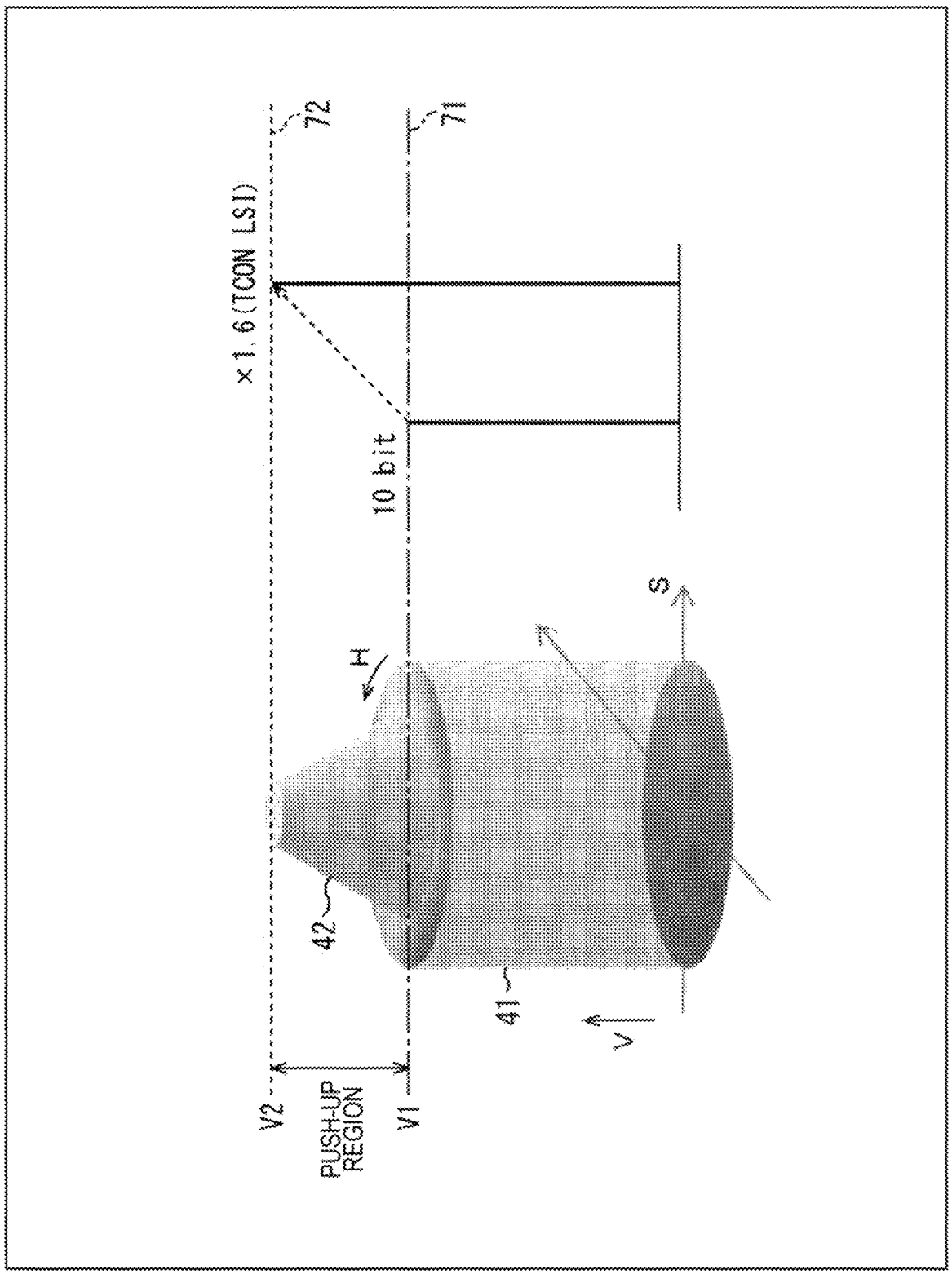
FIG. 9 is a schematic diagram expressing conceptually a push-up region in the case of adopting a constitution of an LSI in the current state.

Here, in FIG. 9, a color gamut capable of being expressed by the display panel 104 is expressed in the HSV color space. As mentioned in the above, in this HSV color space, the azimuth direction represents the hue H, the radial direction represents the saturation S, and the axial direction represents the lightness V. A first line 71 in FIG. 9 corresponds to the first line 71 indicated in the above-mentioned FIG. 8, and a range of color capable of being expressed by subpixels of red (R), green (G), and blue (B) in each pixel arranged in the display panel 104 corresponds to a portion of a column 41 (a range in which the lightness V is V1 or less) in the diagram.

On the other hand, as mentioned in the above, in a range of color capable of being expressed by subpixels of red (R), green (G), and blue (B) and a subpixel of white (W) in each pixel arranged in the display panel 104, in addition to the portion of the column 41 in the diagram, a portion of a cone 42 formed on the column is also included.

In this way, by making a subpixel of white (W) emit light, it is possible to raise the lightness V to V2 higher than V1. That is, in addition to subpixels of red (R), green (G), and blue (B), by providing a subpixel of white (W), it is possible to expand a color gamut capable of being expressed by the display panel 104.

The HDR gain calculating section 205 generates an HDR gain for making it possible to utilize the color gamut expanded by a subpixel of white (W), and supplies it to the DR expanding section 206.

Here, as shown in FIG. 8, the utilization of the color gamut (hereinafter, also referred to a push-up region) expanded by a pixel of white (W) is limited to, for example, a case where the value of an average luminance level (APL) becomes within a range of 0 to 25% (within a range of a region 62 in the diagram). The reason for that is to ensure that the push-up region is utilized only in the case where the value of an average luminance level (APL) is low and electric power has some extra power (in the case where a video image is dark to some extent), because, as a video image (picture pattern) is brighter, a load is applied more to a panel and a power source.

For example, in FIG. 8, in the case where the value of an average luminance level (APL) becomes less than 25%, the HDR gain calculating section 205 makes the HDR gain larger gradually such that a luminance level becomes higher gradually, until the value of the average luminance level (APL) becomes 10%. For example, in the case where the value of an average luminance level (APL) becomes 25%, the HDR gain is made 1.0 (500/500). However, in the case where the value of an average luminance level (APL) becomes 10%, the HDR gain is made 1.6 (800/500).

Moreover, for example, in the case where the value of an average luminance level (APL) becomes 10% or less, the HDR gain calculating section 205 calculates the HDR gain being 1.6 (800/500) as a fixed value.

In this way, in the case where the value of an average luminance level (APL) becomes less than a predetermined threshold (in this example, 25%), an HDR gain is calculated such that the push-up region becomes utilizable, and the dynamic range of a video signal is expanded, whereby it is possible to utilize the color gamut expanded by a subpixel of white (W).

Here, as shown in FIG. 9, in a constitution of an LSI in the current state, a signal including 10-bits for each of RGB to be input from the signal processing circuit 102A to the timing controller circuit 103A corresponds to a range of color capable of being expressed by subpixels of red (R), green (G), and blue (B) in each pixel arranged in the display panel 104 in a portion (a range in which the lightness V is V1 or less) of the column 41 corresponding to the first line 71.

Moreover, in the timing controller circuit 103A, in the case where the value of an average luminance level (APL) becomes less than 25%, for example, by a matter that the dynamic range of a video signal (signal including 10-bits for each of RGB) is expanded on the basis of an HDR gain being 1.6, it is possible to expand a color gamut capable of being expressed so as to include a range of color capable of being expressed by a subpixel of white (W) in a portion (a range in which the lightness V is from V1 to V2) of a cone 42 corresponding to a second line 72.

In this way, in a constitution of an LSI in the current state, by the timing controller circuit 103A disposed to follow the signal processing circuit 102A, a function for utilizing the push-up region that becomes utilizable by providing a subpixel of white (W), is realized.

In this connection, in a constitution of an LSI in the current state, in the case where the value of an average luminance level (APL) becomes less than a predetermined threshold (in this example, 25%), a function for utilizing the push-up region that becomes utilizable by providing a subpixel of white (W), is realized. On the other hand, in the case where the value of an average luminance level (APL) exceeds a predetermined threshold (in this example, 25%), a limit function (ABL) of luminance for a video signal is realized.

(Constitution of LSI in Present Technology)

Figure 10:
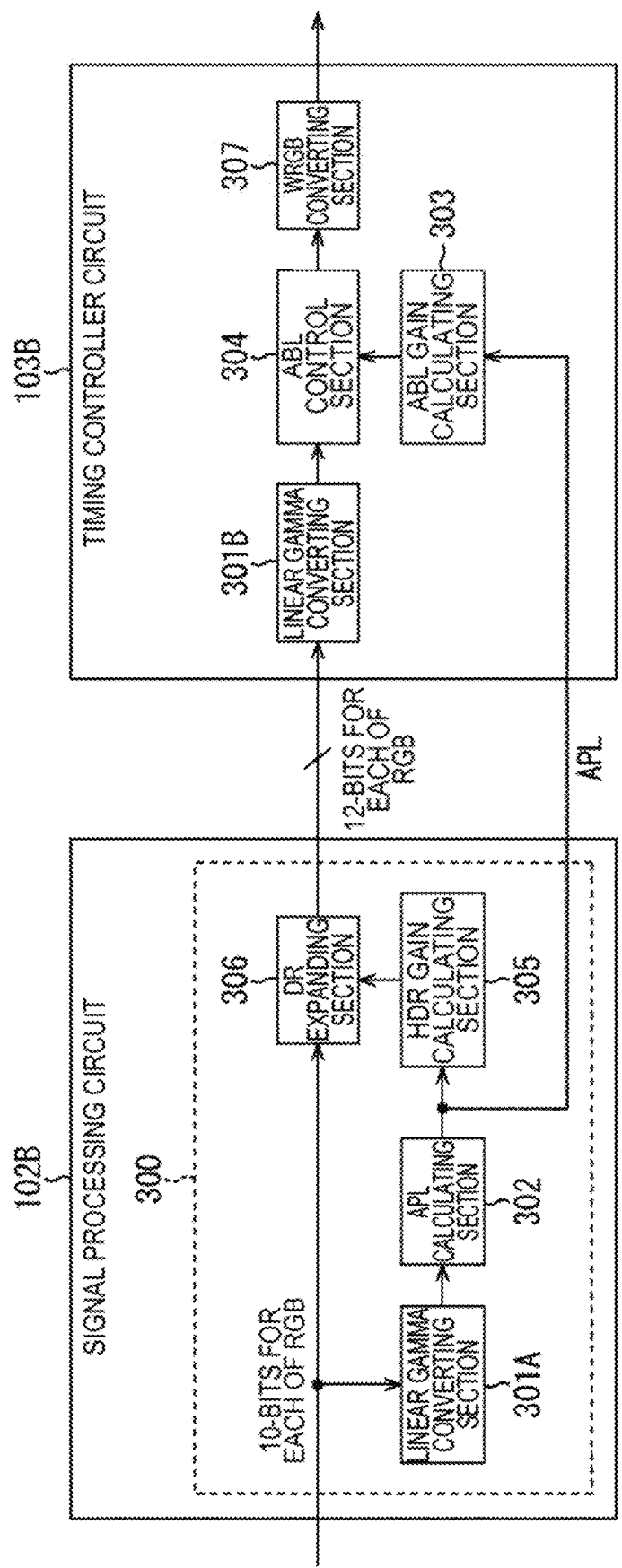
FIG. 10 is a block diagram showing an example of a constitution of a signal processing circuit and a timing controller circuit to which the present technology has been applied.

Next, a constitution of an LSI to which the present technology has been applied is described. FIG. 10 is a block diagram showing an example of a constitution of a signal processing circuit 102B and a timing controller circuit 103B that constitute an LSI to which the present technology has been applied.

In FIG. 10, the signal processing circuit 102B performs predetermined signal processing for a video signal supplied from the video generator 101. The signal processing circuit 102B includes a signal processing section 300. This signal processing section 300 includes a linear gamma converting section 301A, an APL calculating section 302, an HDR gain calculating section 305, and a DR expanding section 306.

A video signal (signal including 10-bits for each of RGB) is input into the signal processing section 300, and supplied to the linear gamma converting section 301A and the DR expanding section 306.

The linear gamma converting section 301A performs signal processing for converting a video signal in which an output has a gamma characteristic relative to an input, so as to have a linear characteristic from the gamma characteristic. The linear gamma converting section 301A supplies the video signal after the conversion to the APL calculating section 302.

On the basis of the video signal supplied from the linear gamma converting section 301A, the APL calculating section 302 calculates an average luminance level (APL), and supplies it to the HDR gain calculating section 305 and the timing controller circuit 103B (the ABL gain calculating section 303 of it).

On the basis of the average luminance level (APL) supplied from the APL calculating section 302, the HDR gain calculating section 305 calculates an HDR gain for expanding a dynamic range of a video signal and acquiring an expanded video signal, and supplies it to the DR expanding section 306. Here, the video signal is made a signal including 10-bits for each of RGB, and the expanded video signal is made a signal including 12-bits for each of RGB.

On the basis of the HDR gain supplied from the HDR gain calculating section 305, the DR expanding section 306 expands the dynamic range (DR) of the video signal (signal including 10-bits for each of RGB) that has been input there, and supplies the expanded video signal (signal including 12-bits for each of RGB) acquired as a result to the timing controller circuit 103B (the linear gamma converting section 301B of it).

Moreover, in FIG. 10, the timing controller circuit 103B includes a linear gamma converting section 301B, an ABL gain calculating section 303, an ABL control section 304, and a WRGB converting section 307. The expanded video signal (signal including 12-bits for each of RGB) and an average luminance level (APL) that are supplied from the signal processing circuit 102B, are input into the timing controller circuit 103B, and are supplied to the linear gamma converting section 301B and the ABL gain calculating section 303.

The linear gamma converting section 301B performs signal processing for converting the expanded video signal in which an output has a gamma characteristic relative to an input, so as to have a linear characteristic from the gamma characteristic. The linear gamma converting section 301A supplies the expanded video signal after the conversion to the ABL control section 304.

On the basis of an average luminance level (APL) supplied from the signal processing circuit 102B (the APL calculating section 302 of it), the ABL gain calculating section 303 calculates a gain (ABL gain) for controlling (ABL) the luminance level of the expanded video signal, and supplies it to the ABL control section 304.

On the basis of the ABL gain supplied from the ABL gain calculating section 303, the ABL control section 304 controls (limits) the luminance level of the expanded video signal supplied from the linear gamma converting section 301B, and supplies it to the WRGB converting section 307.

The WRGB converting section 307 converts the expanded video signal (RGB signal having been subjected to the ABL control) supplied from the ABL control section 304 into a WRGB signal, and outputs it.

The conversion process in here is one that converts an RGB signal including three basic colors of red (R), green (G), and blue (B) into a WRGB signal including three basis colors of red (R), green (G), and blue (B) and one non-basic color of white (W).

Figure 11:
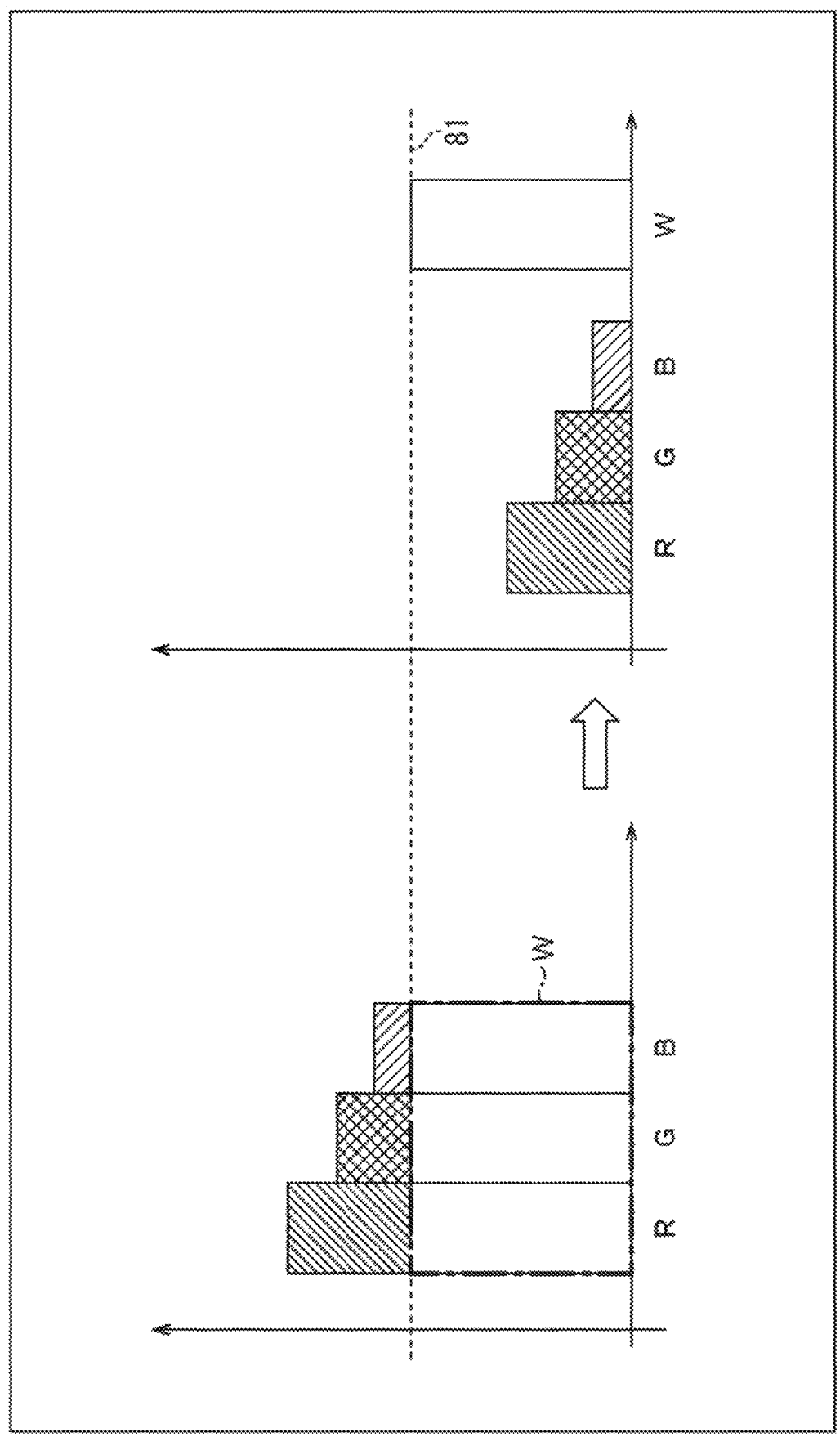
FIG. 11 is a schematic diagram showing an example of conversion from an RGB signal to a WRGB signal in a timing controller circuit to which the present technology has been applied.

FIG. 11 shows schematically an example of conversion from an RGB signal to a WRGB signal. In this connection, in FIG. 11, the left side in the diagram represents an RGB signal before the conversion, and the right side in the diagram represents a WRGB signal after the conversion.

In the WRGB converting section 307, first, the minimum one among the luminance information of three colors of the input RGB signal is made the luminance information of white (W). In this example, since the luminance information of blue (B) becomes the minimum, it is made the luminance information of white (W).

Then, in the WRGB converting section 307, by subtracting the luminance information of white (W) from the luminance information of red (R) before the conversion, the luminance information of red (R) after the conversion is acquired. Similarly, by subtracting the luminance information of white (W) from the luminance information of green (G) before the conversion, the luminance information of green (G) after the conversion is acquired, and by subtracting the luminance information of white (W) from the luminance information of blue (B) before the conversion, the luminance information of blue (B) after the conversion is acquired.

The WRGB converting section 307 outputs the luminance information of red (R), green (G), blue (B), and white (W) acquired by doing in this way, as a WRGB signal.

In this connection, in the case of comparing the example of the conversion in FIG. 11 with the example of the conversion in FIG. 7 mentioned in the above, the luminance information of each of red (R), green (G), and blue (B) has increased, and the luminance information of white (W) has also increased. However, there is no change in a matter that, by subtracting the luminance information of white (W) from the luminance information of each of red (R), green (G), and blue (B) before the conversion, the luminance information of each of red (R), green (G), and blue (B) after the conversion is acquired. Moreover, in FIG. 7 and FIG. 11, a line 81 represents an upper limit value.

The LSI to which the present technology has been applied is constituted as mentioned in the above.

Here, also in the signal processing circuit 102B and the timing controller circuit 103B each having been shown in FIG. 10, in the case of utilizing a relationship (characteristic information) between the average luminance level (APL) and the luminance of the display panel 104 in FIG. 8 mentioned in the above, for example, the following control will be performed.

Namely, the HDR gain calculating section 305 generates an HDR gain for making it possible to utilize a color gamut expanded by a subpixel of white (W), and supplies it to the DR expanding section 306.

Here, as shown in FIG. 8, the utilizing of the push-up region being the color gamut expanded by the pixel of white (W) is limited to, for example, a case where the value of an average luminance level (APL) becomes within a range of 0 to 25%. The reason for that is to ensure that the push-up region is utilized only in the case where the value of an average luminance level (APL) is low and electric power has some extra power, because, as a video image (picture pattern) is brighter, a load is applied more to a panel and a power source.

For example, in FIG. 8, in the case where the value of an average luminance level (APL) becomes less than 25%, the HDR gain calculating section 305 makes the HDR gain larger gradually such that the luminance level becomes higher gradually, until the value of the average luminance level (APL) becomes 10%. For example, in the case where the value of an average luminance level (APL) becomes 25%, the HDR gain is made 1.0 (500/500). However, in the case where the value of an average luminance level (APL) becomes 10%, the HDR gain is made 1.6 (800/500).

Moreover, for example, in the case where the value of an average luminance level (APL) becomes 10% or less, the HDR gain calculating section 305 calculates the HDR gain being 1.6 (800/500) as a fixed value.

In this connection, in here, the case where the HDR gain is calculated on the basis of the value of an average luminance level (APL), has been exemplified. However, at the time of calculating the HDR gain, in addition to the measurement of an average luminance level (APL), for example, a video image analyzing process, such as histogram measurement, may be performed, and then, its analysis result may be made to be reflected on the value of the HDR gain. Namely, in here, by analyzing what kind of image (for example, an image of a star in the night sky) a frame image acquired from a video signal is, it is possible to calculate an HDR gain corresponding to the analysis result.

In this way, in the case where the value of an average luminance level (APL) becomes less than a predetermined threshold (in this example, 25%), an HDR gain is calculated such that a push-up region becomes utilizable, and the dynamic range of a video signal is expanded, whereby it becomes possible to utilize the color gamut expanded by a subpixel of white (W).

Figure 12:
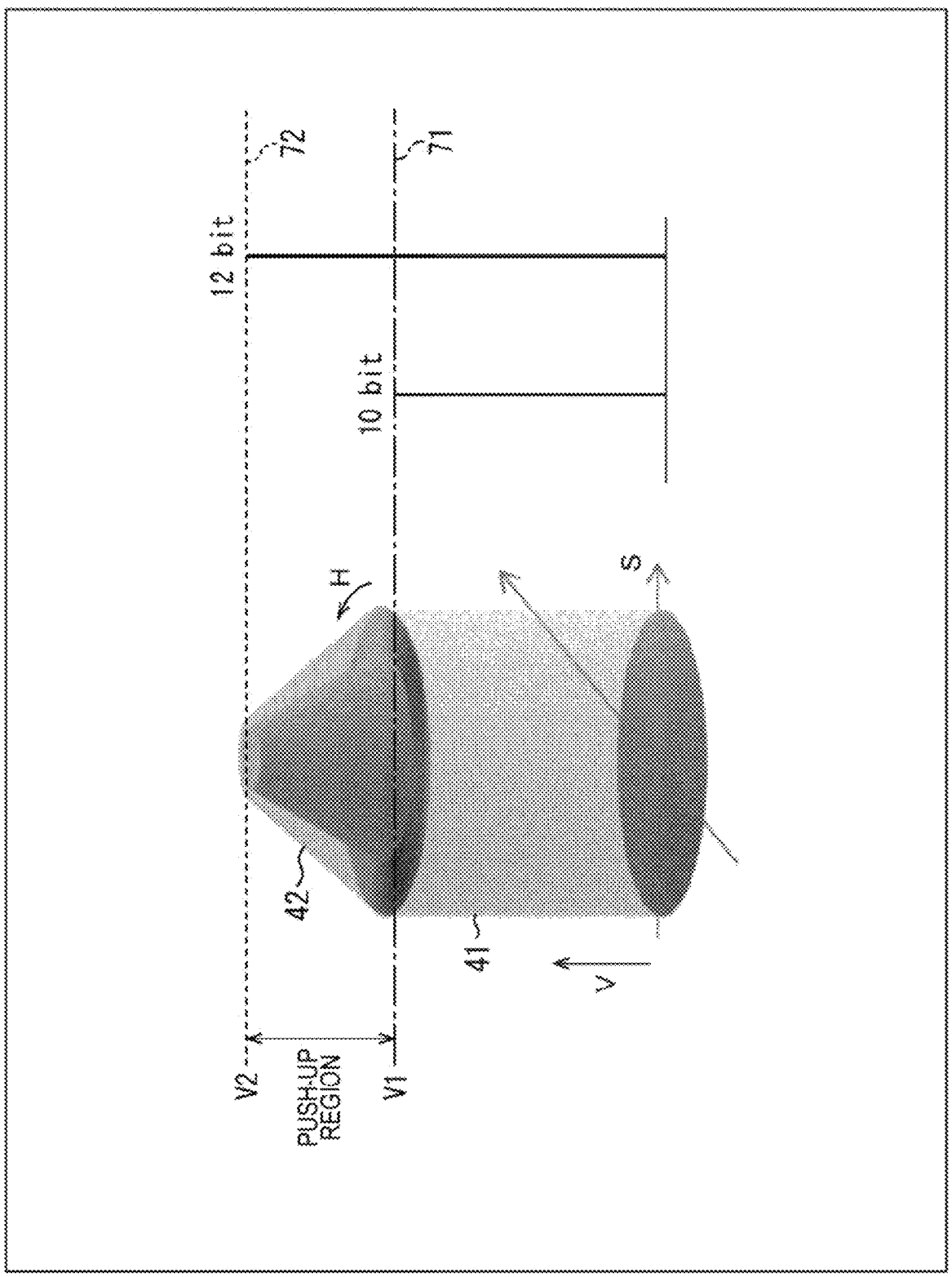
FIG. 12 is a schematic diagram expressing conceptually a push-up region in the case of adopting an LSI to which the present technology has been applied.

Here, in FIG. 12, a color gamut capable of being expressed by the display panel 104 is expressed with an HSV color space. As mentioned in the above, in this HSV color space, an azimuth direction represents hue H (Hue), a radial direction represents saturation S (Saturation), and an axial direction represents lightness V (Value). A first line 71 in FIG. 12 corresponds to the first line 71 in FIG. 8 mentioned in the above. A range of color capable of being expressed by subpixels of red (R), green (G), and blue (B) in each pixel arranged in the display panel 104 corresponds to a portion (a range in which brightness V is V1 or less) of a column 41 in the diagram.

On the other hand, as mentioned in the above, in a range of color capable of being expressed by subpixels of red (R), green (G), and blue (B) and a subpixel of white (W) in each pixel arranged in the display panel 104, in addition to a portion of the column 41 in the diagram, a portion of a cone 42 formed on the column is also included.

In this way, by making a subpixel of white (W) emit light, it is possible to raise the lightness V to V2 higher than V1. That is, in addition to subpixels of red (R), green (G), and blue (B), by providing a subpixel of white (W), it is possible to expand a color gamut capable of being expressed.

Here, as shown in FIG. 12, in a constitution of an LSI to which the present technology has been applied, a signal including 10-bits for each of RGB to be input into the DR expanding section 306 of the signal processing circuit 102B corresponds to a range of color capable of being expressed by subpixels of red (R), green (G), and blue (B) in the display panel 104 in a portion (a range in which the lightness V is V1 or less) of the column 41 corresponding to the first line 71.

Moreover, in the DR expanding section 306, in the case where the value of an average luminance level (APL) becomes less than 25%, for example, by expanding the dynamic range of a video signal (signal including 10-bits for each of RGB) on the basis of an HDR gain being 1.6 and generating an expanded video signal (signal including 12-bits for each of RGB), it is possible to expand a color gamut capable of being expressed so as to include a range of color capable of being expressed by a subpixel of white (W) in a portion (a range in which the lightness V is from V1 to V2) of the cone 42 corresponding to a second line 72.

In this way, in the constitution of the LSI to which the present technology has been applied, by the signal processing circuit 102B (the HDR gain calculating section 305, the DR expanding section 306, and so on, of it), a function for utilizing the push-up region that becomes utilizable by providing a subpixel of white (W), is realized. In here, a signal including 12-bits for each of RGB is input from the signal processing circuit 102B into the timing controller circuit 103B.

In this connection, in the timing controller circuit 103B having been shown in FIG. 10, by utilizing the relationship between the average luminance level (APL) and the luminance of the display panel 104 in FIG. 8 mentioned in the above, in the ABL control section 304, on the basis of the value of the ABL gain from the ABL gain calculating section 303, it is possible to perform control in such a way that as the value of an average luminance level (APL) is larger, the luminance level of an expanded video signal is made lower. For example, in the case where an average luminance level (APL) being 100% has been calculated, the luminance being 500 cd/m$^2$ is dropped up to 150 cd/m$^2$.

That is, as a video image (picture pattern) displayed on the display panel 104 constituted as an organic EL display panel becomes brighter (brilliant more), a load is applied more to a panel and a power source. Accordingly, in here, as an average luminance level (APL) is becoming higher, the level of the luminance of an expanded video signal is made to be lowered gradually.

For example, in the case where the luminance corresponding to a range of color capable of being expressed by subpixels of red (R), green (G), and blue (B) in the display panel 104 becomes 500 cd/m$^2$, when 100% has been calculated as an average luminance level (APL), the ABL gain is acquired as follows.

Namely, at this time, since an average luminance level (APL) becomes 100%, it is necessary to limit the luminance level up to the luminance being 150 cd/m$^2$. Accordingly, the ABL gain calculating section 303 supplies a gain being 0.3 (150/500) as the ABL gain to the ABL control section 304. With this, on the basis of the ABL gain being 0.3, the ABL control section 304 controls (limits) the luminance level of an expanded video signal.

In this connection, in the constitution of the LSI to which the present technology has been applied, in the case where the value of an average luminance level (APL) becomes less than a predetermined threshold (in this example, 25%), a function for utilizing the push-up region that becomes utilizable by providing a subpixel of white (W), is realized. On the other hand, in the case where the value of an average luminance level (APL) exceeds a predetermined threshold (in this example, 25%), a limit function (ABL) of luminance for a video signal is realized.

As described in the above, according to the present technology, by expanding a signal including 10-bits for each of RGB to a signal including 12-bits for each of RGB by the signal processing circuit 102B disposed at the former stage of the timing controller circuit 103B, it is possible to actively utilize maximally a color gamut capable of being expressed by the display panel 104 (for example, organic EL display panel) in which WRGB pixels each including four subpixels of red (R), green (G), blue (B), and white (W) are arranged two-dimensionally as a plurality of pixels (display pixels).

Namely, in addition to subpixels of red (R), green (G), and blue (B), by providing a subpixel of (W), it becomes possible to expand a color gamut capable of being expressed by the display panel 104. However, in the present technology, by expanding the bits of RGB (for example, 10 bits of each of RGB are expanded to 12 bits of each of RGB) beforehand on the signal processing circuit 102B side, a signal corresponding to a range of color capable of being expressed by a subpixel of white (W) is made to be input into the timing controller circuit 103B.

In more concrete terms, in the HSV color space in FIG. 12 mentioned in the above, by making a subpixel of white (W) emit light, it is possible to raise the lightness V to V2 higher than V1. However, with regard to this push-up region, for example, it becomes to be expressed by two bits corresponding to increased bits at the time of having expanded 10 bits of each of RGB to 12 bits of each of RGB.

Here, for example, in the case where a panel maker supplies the display panels 104, such as an organic EL display panel, for a TV (television) manufacturer that manufactures the display device 10 (thin type television receiver), such as an organic EL display device, it is supposed a case in which, a design, manufacture, etc. of the signal processing circuit 102B such as a signal processing LSI etc. used for TV are performed by the TV manufacturer, on the other hand, a design, manufacture, etc. of the timing controller circuit 103B, such as TCON•LSI used for a panel, are performed by the panel maker.

In such a case, on the TV manufacturer side that performs a design, manufacture, etc. of the signal processing circuit 102B, there is a request to want to realize image quality intended by the concerned TV manufacturer. In the present technology, it is possible to respond to such a request, because, by expanding the bits of RGB on the signal processing circuit 102B side, it is made possible to actively utilize maximally a color gamut capable of ben expressed by the display panel 104 (for example, organic EL display panel) in which WRGB pixels are arranged two-dimensionally.

Moreover, in the present technology, as a result of comparison between the value of an average luminance level (APL) and a threshold, in the case where a frame image becomes dark to some extent (for example, the value of an average luminance level (APL) becomes within a range of 0 to 25%), that is, only in the case where the electric power has some extra power, a color gamut expanded by a subpixel of white (W) is made to be utilized (is made to be pushed up). Accordingly, it is possible to suppress power consumption. In this connection, since a subpixel of white (W) has high light emission efficiency as compared with the subpixels of other colors, even if a subpixel of white (W) emits light, electric power is not consumed than the subpixels of other colors.

<2. Modified Example>

In the description mentioned in the above, the description has been given on the assumption that the signal processing circuit 102 and the timing controller circuit 103 are elements constituting the display device 10. However, the signal processing circuit 102 and the timing controller circuit 103 may be regarded as a signal processing device, a timing controller device, and the like, as an independent device.

Moreover, in the description mentioned in the above, as the display device 10, the description has been given for, as one example, a self-light-emission type display device, such as an organic EL display device etc. including a large-sized organic EL display panel that has circumstances peculiar to manufacturability. However, the present technology can be applied not only to the organic EL display device, but also to various display devices. Furthermore, in the description mentioned in the above, as the display device 10, the description has been given for, as one example, a thin type television receiver, a business-use display device, and the like. However, it can be applied to various electronic devices, for example, such as an information device and a portable device.

In the description mentioned in the above, as the expansion of bits on the signal processing circuit 102B side, an example where 10 bits of each of RGB are expanded to 12 bits of each of RGB, has been shown. However, the bits after the expansion are not limited to 12 bits of each of RGB. For example, such as 11 bits of each of RGB and 13 bits of each of RGB, it is permissible if they are bits that can express a range of color capable of being expressed by a subpixel of white (W).

Moreover, in the description mentioned in the above, the description has been given on the assumption that each pixel arranged two-dimensionally in the display panel 104 includes four subpixels of red (R), green (G), blue (B), and white (W). However, the colors of the subpixels are not limited to these. For example, in place of a subpixel of white (W), a subpixel of other color with high visibility equivalent to white (W) may be used.

In this connection, in the present specification, "2K video image" is a video image corresponding to the screen resolution of approximately 1920×1080 pixels, and "4K video image" is a video image corresponding to the screen resolution of approximately 3840×2160 pixels. Moreover, in the description mentioned in the above, as a video image of contents, a 2K video image and a 4K video image have been described. Further high quality contents such as an 8K video image etc. may be permissible. Incidentally, "8K video image" is a video image corresponding to the screen resolution of approximately 7680×4320 pixels.

It should be noted that the embodiment of the present technology should not be limited to the above-mentioned embodiment. In a range of not departing from the summary of the present technology, various modifications are possible.

Additionally, the present technology may also be configured as below.

(1) A display device, including:
 a display section in which display pixels that each include a first subpixel, a second subpixel, and a third subpixel that emit three-basic-color light and a fourth subpixel that emits non-basic-color light are arranged two-dimensionally;
 a first signal processing section that expands a video signal being input and corresponding to the basic-color light and adapts the video signal to a color gamut that the display section can express; and
 a second signal processing section that converts an expanded video signal being the video signal having been expanded into a first signal, a second signal, and a third signal that correspond to the basic-color light and a fourth signal that corresponds to the non-basic-color light, and outputs the signals to the display section.

(2) The display device according to (1), in which the first signal processing section includes
 a first gain calculating section that calculates a first gain for expanding a dynamic range of the video signal and acquiring the expanded video signal, and
 a DR expanding section that expands a dynamic range of the video signal on the basis of the calculated first gain.

(3) The display device according to (2),
 in which the first signal processing section further includes
  an average luminance level calculating section that calculates an average luminance level of a frame image acquired from the video signal, and
 the first gain calculating section calculates the first gain on the basis of the calculated average luminance level.

(4) The display device according to (3), in which the second signal processing section includes
 a color signal converting section that converts the expanded video signal into the first signal, the second signal, the third signal, and the fourth signal.

(5) The display device according to (4),
  in which the second signal processing section further includes
    a second gain calculating section that calculates a second gain for controlling a luminance level of the expanded video signal on the basis of the calculated average luminance level, and
    a luminance control section that controls a luminance level of the expanded video signal on the basis of the calculated second gain, and
  the color signal converting section converts the expanded video signal whose luminance level has been controlled into the first signal, the second signal, the third signal, and the fourth signal.
(6) The display device according to (5), in which the first gain and the second gain each is a value acquired in accordance with characteristic information in which the average luminance level and a luminance level of the display section are associated.
(7) The display device according to (6), in which in a case where the average luminance level becomes less than a predetermined threshold, the first gain calculating section calculates a first gain for expanding a dynamic range of the video signal on the basis of the characteristic information.
(8) The display device according to (6) or (7), in which in a case where the average luminance level exceeds a predetermined threshold, the second gain calculating section calculates a second gain for lowering a luminance level of the expanded video signal on the basis of the characteristic information.
(9) The display device according to any one of (1) to (8),
  in which the basic-color light includes red light, green light, and blue light, and
  the non-basic-color light is white light.
(10) The display device according to any one of (1) to (9),
  in which the display pixel is a pixel including a light emitting element that self-emits light in accordance with an amount of an electric current, and
  the display section is a self-light-emission display section.
(11) A signal processing device, including:
  a signal processing section that expands a video signal that is input, and outputs an expanded video signal adapted to a color gamut that a display section can express,
  in which in the display section, display pixels that each include a first subpixel, a second subpixel, and a third subpixel that emit three-basic-color light and a fourth subpixel that emits non-basic-color light are arranged two-dimensionally, and
  the video signal is a signal corresponding to the basic-color light.
(12) The signal processing device according to (11), in which the signal processing section includes
  a gain calculating section that calculates a gain for expanding a dynamic range of the video signal and acquiring the expanded video signal, and
  a DR expanding section that expands a dynamic range of the video signal on the basis of the calculated gain.
(13) The signal processing device according to (12),
  in which the signal processing section further includes
    an average luminance level calculating section that calculates an average luminance level of a frame image acquired from the video signal, and
  the gain calculating section calculates the gain on the basis of the calculated average luminance level.
(14) The signal processing device according to (13), in which the gain is a value acquired in accordance with characteristic information in which the average luminance level and a luminance level of the display section are associated.
(15) The signal processing device according to (14), in which in a case where the average luminance level becomes less than a predetermined threshold, the gain calculating section calculates a gain for expanding a dynamic range of the video signal on the basis of the characteristic information.
(16) The signal processing device according to any one of (11) to (15),
  in which the basic-color light includes red light, green light, and blue light, and
  the non-basic-color light is white light.
(17) The signal processing device according to any one of (11) to (16),
  in which the display pixel is a pixel including a light emitting element that self-emits light in accordance with an amount of an electric current, and
  the display section is a self-light-emission display section.
(18) The signal processing device according to any one of (11) to (17),
  in which the signal processing section outputs the expanded video signal to a subsequent signal processing device, and
  the subsequent signal processing device converts the expanded video signal into a first signal, a second signal, and a third signal that correspond to the basic-color light and a fourth signal that corresponds to the non-basic-color light, and outputs the signals to the display section.

REFERENCE SIGNS LIST 10 display device
101 video generator
102 and 102B signal processing circuit
103 and 103B timing controller circuit
104 display panel
300 signal processing section
301A and 301B linear gamma converting section
302 APL calculating section
303 ABL gain calculating section
304 ABL control section
305 HDR gain calculating section
306 DR expanding section
307 WRGB converting section

The invention claimed is:
1. A display device, comprising:
  a display; and
  circuitry configured to:
    expand a dynamic range of a video signal having a gamma characteristic which is not a linear characteristic, into an expanded video signal adapted to a color gamut that the display can express, wherein the expanded video signal includes a first signal, a second signal, and a third signal that corresponds to basic-color light; and
    convert the expanded video signal into a converted first signal into a converted second signal, and a converted third signal that correspond to the basic-color light and a fourth signal that corresponds to non-basic-color light,
    wherein a minimum one among luminance information of the first signal, second signal, and third signal is used to set luminance information of the fourth signal, and wherein the converted first signal, converted second signal, and converted third signal are formed by reducing each of the first signal, second signal, and third signal according to the luminance information of the fourth signal.

2. The display device according to claim 1, wherein the basic-color light includes red light, green light, and blue light, and the non-basic-color light is white light.

3. The display device according to claim 1, wherein display pixels have a pixel including a light emitting element configured to self-emit light in accordance with an amount of an electric current, and the display is a self-light-emission display.

4. The display device according to claim 1, wherein the circuitry configured to convert the expanded video signal includes a timing controller configured to convert the expanded video signal into the converted first signal, the converted second signal, the converted third signal, and the fourth signal.

5. The display device according to claim 1, wherein the display device includes a V-by-One interface between the circuitry configured to expand a dynamic range of a video signal and the circuitry configured to convert the expanded video signal.

6. The display device according to claim 1, wherein the circuitry is configured to determine a high dynamic range (HDR) gain for use in expanding the dynamic range of the video signal.

7. The display device according to claim 6, wherein the HDR gain is determined in accordance with an average luminance level (APL) of a frame image acquired from the video signal.

8. The display device according to claim 7, wherein in a case where the average luminance level exceeds a threshold, the circuitry is configured to determine a second gain for lowering a luminance level of the expanded video signal on a basis of characteristic information indicating a relationship between the average luminance level and a luminance level of the display.

9. The display device according to claim 1, wherein basic-color light includes red light, green light, and blue light, and the non-basic-color light is white light.

10. The display device according to claim 1, wherein display pixels include an organic light emitting diode (OLED) element.

11. The display device according to claim 1, wherein the circuitry is configured to output a signal to the display in accordance with the converted first signal, the converted second signal, the converted third signal and the fourth signal.

12. The display device according to claim 1, further comprising a backlight, wherein the display is a liquid crystal display.

13. The display device according to claim 1, wherein the display device is a television receiver.

14. A display device, comprising:
a display in which each display pixel includes a first subpixel, a second subpixel, and a third subpixel configured to emit basic-color light and a fourth subpixel configured to emit non-basic-color light;
circuitry configured to:
expand a dynamic range of a video signal having a gamma characteristic which is not a linear characteristic, into an expanded video signal adapted to a color gamut that the display can express, wherein the expanded video signal includes a first signal, a second signal, and a third signal that correspond to the basic-color light; and
convert the expanded video signal into a converted first signal, a converted second signal, and a converted third signal that correspond to the basic-color light and a fourth signal that corresponds to the non-basic-color light,
wherein luminance information of the fourth signal is based on luminance information of the first signal, second signal, and third signal, and the converted first signal, converted second signal, and converted third signal are formed by reducing luminance information of the first signal, second signal, and third signal according to the luminance information of the fourth signal.

15. The display device according to claim 14, wherein the basic-color light includes red light, green light, and blue light, and the non-basic-color light is white light.

16. The display device according to claim 14, wherein the display belongs to a group comprising an organic light emitting diode (OLED) display and liquid crystal display (LCD).

17. The display device according to claim 14, wherein the display device includes a V-by-One interface between the circuitry configured to expand a dynamic range of a video signal and the circuitry configured to convert the expanded video signal.

18. The display device according to claim 14, wherein the circuitry is configured to determine a high dynamic range (HDR) gain for use in expanding the dynamic range of the video signal in accordance with an average luminance level (APL) of a frame image acquired from the video signal.

19. The display device according to claim 14, wherein the basic-color light includes red light, green light, and blue light, and the non-basic-color light is white light.

20. The display device according to claim 14, wherein the circuitry is configured to output a signal to the display in accordance with the converted first signal, the converted second signal, the converted third signal and the fourth signal.

21. The display device according to claim 14, wherein the display device is a television receiver.

* * * * *